United States Patent
Van Veen et al.

(10) Patent No.: US 9,208,989 B2
(45) Date of Patent: Dec. 8, 2015

(54) LITHOGRAPHY SYSTEM AND METHOD OF REFRACTING

(75) Inventors: Alexander Hendrik Vincent Van Veen, ER Rotterdam (NL); Yanxia Zhang, NC Eindhoven (NL); Gun Sari Mari Berglund, RM Delft (NL); Pieter Kruit, EB Delft (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 750 days.

(21) Appl. No.: 13/295,243

(22) Filed: Nov. 14, 2011

(65) Prior Publication Data
US 2012/0145915 A1    Jun. 14, 2012

Related U.S. Application Data

(60) Provisional application No. 61/413,396, filed on Nov. 13, 2010, provisional application No. 61/414,594, filed on Nov. 17, 2010.

(51) Int. Cl.
*H01J 3/26* (2006.01)
*H01J 37/09* (2006.01)

(52) U.S. Cl.
CPC ........... *H01J 37/09* (2013.01); *H01J 2237/002* (2013.01); *H01J 2237/0453* (2013.01); *H01J 2237/1534* (2013.01); *H01J 2237/31774* (2013.01)

(58) Field of Classification Search
CPC ............... H01J 37/3174; H01J 2237/31774; H01J 2237/0435; G21K 1/065
USPC ......... 250/396 R, 492.3, 492.1; 313/412, 409
See application file for complete search history.

(56) References Cited

U.S. PATENT DOCUMENTS

| | | | |
|---|---|---|---|
| 5,557,110 A | 9/1996 | Itoh | |
| 6,001,511 A | 12/1999 | Tamura | |
| 6,541,169 B1 | 4/2003 | Okino et al. | |
| 6,768,125 B2 * | 7/2004 | Platzgummer et al. .. | 250/492.22 |
| 8,039,813 B2 | 10/2011 | Casares et al. | |
| 2004/0217435 A1 | 11/2004 | Omori et al. | |
| 2004/0232349 A1 * | 11/2004 | Kruit ......................... | 250/396 R |
| 2007/0018112 A1 * | 1/2007 | Kruit ......................... | 250/396 R |
| 2007/0029499 A1 * | 2/2007 | Kruit ......................... | 250/396 R |
| 2008/0073547 A1 * | 3/2008 | Kruit ......................... | 250/396 R |
| 2009/0212229 A1 * | 8/2009 | Wieland et al. ........... | 250/396 R |
| 2010/0084566 A1 * | 4/2010 | Kim ....................... | 250/396 ML |
| 2012/0061583 A1 * | 3/2012 | Wieland et al. ........... | 250/396 R |

FOREIGN PATENT DOCUMENTS

| EP | 2019415 A1 | 1/2009 |
|---|---|---|
| EP | 2 302 457 A2 | 3/2011 |

(Continued)

*Primary Examiner* — Michael Maskell
(74) *Attorney, Agent, or Firm* — Hoyng Rock Monegier LLP; David P. Owen

(57) ABSTRACT

A charged particle lithography system for transferring a pattern onto the surface of a target, such as a wafer, comprising a charged particle source adapted for generating a diverging charged particle beam, a converging means for refracting said diverging charged particle beam, the converging means comprising a first electrode, and an aperture array element comprising a plurality of apertures, the aperture array element forming a second electrode, wherein the system is adapted for creating an electric field between the first electrode and the second electrode.

22 Claims, 6 Drawing Sheets

(56) References Cited

FOREIGN PATENT DOCUMENTS

| WO | WO 2006/084298 A1 | 8/2006 |
| WO | WO 2007/013802 A1 | 2/2007 |
| WO | WO 2008/013442 A1 | 1/2008 |
| WO | WO 2010/037832 A2 | 4/2010 |

* cited by examiner

LITHOGRAPHY SYSTEM AND METHOD OF REFRACTING

BACKGROUND OF THE INVENTION

1. Field of the Invention

The present invention relates to an imaging system and in particular to a charged particle multi-beamlet lithography system or inspection system.

2. Description of the Related Art

Currently, most commercial lithography systems use a mask as a means to store and reproduce the pattern data for exposing a target, such as a wafer with a coating of resist. In a maskless lithography system, beamlets of charged particles are used to write the pattern data onto the target. The beamlets are individually controlled, for example by individually switching them on and off, to generate the required pattern. For high resolution lithography systems designed to operate at a commercially acceptable throughput, the size, complexity, and cost of such systems becomes an obstacle.

Furthermore, existing charged particle beam technology is suitable for lithography systems for relatively course patterning of images, for example to achieve critical dimensions of 90 nm and higher. However, a growing need exists for improved performance. It is desired to achieve considerably smaller critical dimensions, for example 22 nm, while maintaining sufficient wafer throughput, e.g. between 10 and 100 wafers per hour. In order to achieve such a large throughput at ever decreasing feature sizes it is necessary to increase the current in the charged particle beam. An unwanted effect of this increase is that due to the higher current the interactions between the charged particles will increase leading to loss of resolution.

To counteract said interactions between the charged particles it is necessary to increase the field size of the system, that is the size of the area that is exposed in one cycle. In this manner, the interactions are reduced.

For such a system to provide accurate writing of a pattern on a target such as a wafer, it is essential that the charged particle beam is projected onto the target with highly controlled characteristics. Errors in the projection system will deteriorate the projected image. Throughout the charged particle optical system many factors contribute to errors in the pattern.

One such main contributor is the so-called collimator, which functions to create a substantially parallel charged particle beam from the diverging beam emanating from the charged particle source.

Known systems often apply electrostatic lenses comprising multiple electrodes for the focusing or collimating of a charged particle beam. It is a known problem with this type of lens that it suffers from spherical and chromatic aberrations, introduced by the electrodes of the lens, reducing the quality of the projected images. When increasing the field size of the exposure, these aberrations only increase.

As such the known lenses typically allow for some control of aberrations or beam uniformity, however these cannot provide both requirements to the level required by high-end charged particle lithography. The known designs cannot reliably and cost effectively provide the reduction in critical dimensions, as required by the roadmap for future development of the lithography industry. To maintain a commercially feasible throughput, the reduction in critical dimensions typically necessitates an increase in charged particles that can be deposited on the target. One way of achieving this increase is by massively increasing the number of beamlets used. This is not possible with the known designs.

One such system disclosed in WO2007/013802 comprises a charged particle column operating in vacuum with a charged particle source including a charged particle extraction means, a means for creating a plurality of parallel beamlets from the extracted charged particles and a plurality of electrostatic lens structures comprising electrodes. The electrostatic lens structures serve amongst other the purpose of focussing and blanking the beamlets. Blanking in this system is realised by deflecting one or a multiplicity of such usually focused charged particle beams to prevent the particle beam or multiplicity of beamlets from reaching the target such as a wafer. For realizing the final part of the projection on the target of a computer based image pattern, non-blanked beamlets are, at a final set of such electrostatic lenses deflected in a so-called writing direction, thereby scanned over the target surface, as part of the imaging process of the target.

Another charged particle system is known from WO2010/037832, relating to a charged particle lithography system comprising an electrostatic lens or lens array, describing a subdivision of the projection field into areas comprising apertures which are used for letting charged particle beams pass, apertures not used for letting beams pass, and bars which do not comprise apertures, but are included for mechanical strength.

A solution is therefore needed which can be scaled up to the required massive amounts of parallel charged particle beams whilst reducing aberrations to levels suited for high-end charged particle lithography.

BRIEF SUMMARY OF THE INVENTION

A goal of the present invention is to overcome the problems as identified in the known systems. This goal is achieved by providing a charged particle system including a lithography system for transferring a pattern onto the surface of a target, such as a wafer, comprising a charged particle exposure tool for transferring a pattern onto the surface of a target, the exposure tool comprising a charged particle source adapted for generating a diverging charged particle beam and a converging means for refracting said diverging charged particle beam, the converging means comprising a first electrode and an aperture array element comprising a plurality of apertures, included so as to form a second electrode, adapted for creating an electric field between the first electrode and the second electrode.

By applying an electric field between the first electrode and the second electrode, which is embodied as an aperture array, it becomes possible to significantly reduce aberrations introduced by the collimation of the electron beam. By having the electric field from the first electrode terminate at a specific charge on a conductor placed in the beam, the level of reduction of aberrations that can be achieved is much higher than otherwise would be possible by mere adjustment of the voltages and geometry of the converging means. This in turn allows the field size of the exposure to be increased to the required levels.

In a further embodiment the electric field is an accelerating electric field.

In a further embodiment the accelerating electric field is created by arranging the first electrode at a relatively lower electric potential with respect to the second electrode.

In a further embodiment the second electrode is subdivided into alternating aperture free areas and areas where apertures are present. As a result of the presence of aperture, beamlets may be created as they can pass the aperture array. A non-beam area is an area free of apertures. As a result, no beamlets are created in such areas.

In a further embodiment the aperture free areas are provided with blind holes. In this manner, the electric field between the first and second electrodes remains uniform over the alternating beam and non-beam areas, even at the edges of said areas.

In a further embodiment the aperture free areas are included at a level raised above the aperture free areas. In this manner, again the electric field between the first and second electrodes remains uniform over the alternating beam and non-beam areas.

In a further embodiment the aperture free areas are provided with conduits for a cooling medium. The use of cooling within the non-beam areas may improve the performance of the exposure tool.

In a further embodiment the apertures are included recessed from the surface facing the source.

In a further embodiment said apertures are included at a level free of electric fields. The electric field will "bulge" into the recesses, changing the uniformity of the electric field.

In a further embodiment the recessed apertures form a negative lens under influence of the electric field.

In a further embodiment the fill factor of the first electrode is larger than 50%.

In a further embodiment the fill factor of the apertures in the second electrode is larger than 50%.

In a further embodiment the converging means further comprises at least three electrodes, in the form of an Einzel lens, which may be used for collimating the charged particle beam.

In a further embodiment a electrode has a curved side facing the charged particle beam with a radius of curvature between 30 and 70 mm, to ensure no electrical breakdown occurs.

It has been noticed that not in all cases the aberrations are reduced to the required levels. In a further embodiment the aperture array element is provided with a curved surface. In this manner, aberrations resulting from the electrodes can be reduced.

In a further embodiment said curved surface is included at a source facing side.

In a further embodiment the curved surface is shaped according to a cosine function centred around the optical axis of the system.

In a further embodiment the circumference of the curved surface is substantially larger than the height of the curved surface.

In a further embodiment the radius of the curved surface is larger than the radius of the charged particle beam.

In a further embodiment the apertures have a first diameter d1 at a side facing the source and a second diameter d2 at a side facing the target and wherein d1 is smaller than d2.

In a further embodiment the converging means consists of a first electrode in the form of a single element collimator lens.

In a further embodiment the first electrode comprises a convex first portion and a second convex portion, the first portion having a first cross section, the second portion having a second cross section, wherein the average diameter of the second cross section is greater than the average diameter of the first cross section.

In a further embodiment the height of the first portion is greater than the height of the second portion.

In a further embodiment the first section and the second section are joined using a rounded joint.

In a further embodiment the first electrode is made out of plate material.

The invention also comprises a method of refracting a diverging charged particle beam, the method comprising providing a diverging charged particle beam by means of a charged particle source, further refracting the diverging charged particle beam by means of a converging means comprising a first electrode and a second electrode, the second electrode taking the form of an aperture array; creating an accelerating electric field between the first electrode and the second electrode and generating a plurality of substantially parallel charged particle beamlets from the refracted charged particle beam.

The invention further comprises an aperture array element for use in a charged particle lithography system, the element comprising a plurality of apertures and being subdivided into alternating aperture-free areas and areas where a plurality of apertures are present. The aperture array element may have any of the characteristics mentioned above for the aperture array of the charged particle system.

The invention further comprises a charged particle beam generator, which comprises a charged particle source adapted for generating a diverging charged particle beam, a converging means for refracting said diverging charged particle beam, the converging means comprising a first electrode, and an aperture array element forming a second electrode, wherein the system is adapted for creating an electric field between the first electrode and the second electrode. The electrodes, converging means, and aperture array element may have any of the characteristics mentioned above for these elements of the charged particle system.

The invention further comprises a method wherein the accelerating electric field is created by placing the first electrode at a relatively lower electric potential as compared to the second electrode.

BRIEF DESCRIPTION OF THE DRAWINGS

The features and advantages of the invention will be appreciated upon reference to the following drawings, in which.

DESCRIPTION OF ILLUSTRATIVE EMBODIMENTS

Figure 1:
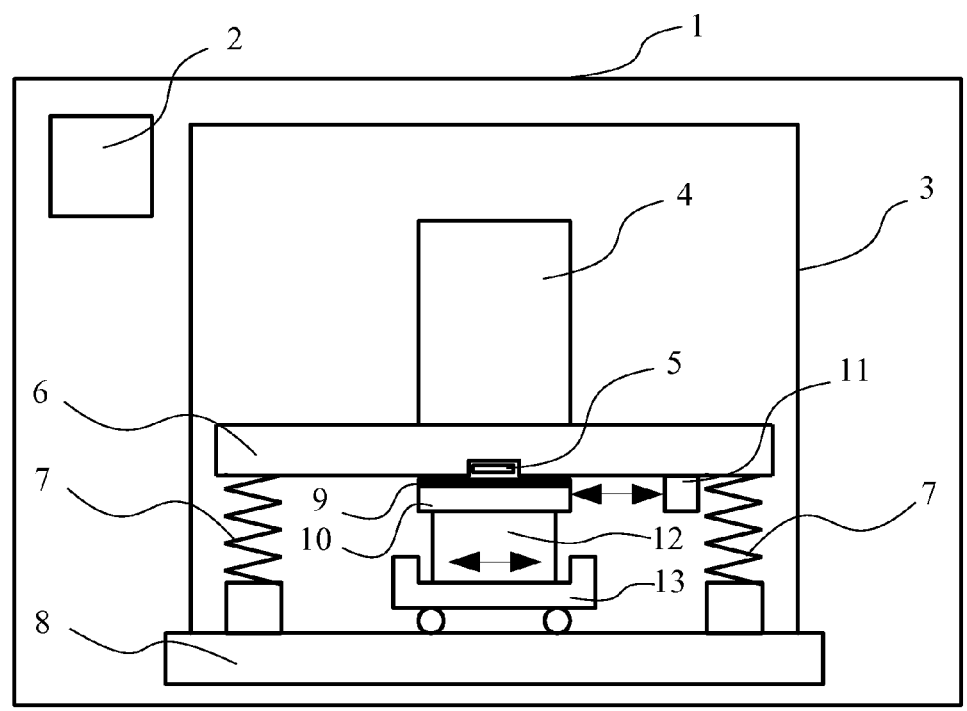
FIG. 1 schematically shows a known charged particle lithography system including the wafer stage components.

The following is a description of certain embodiments of the invention, given by way of example only and with reference to the drawings. FIG. 1 schematically shows a charged particle system 1 for projecting an image, in particular a control system provided image, onto a target. The system includes the wafer stage components to which part of the present invention relates in particular. In this design the charged particle system comprises a control system 2, a vacuum chamber 3 mounted on the base frame 8, which contains the charged particle column 4, the metro frame 6 and the target positioning system 9-13. The target 9 will generally be a wafer provided with a charged particle sensitive layer on the substrate surface. Target 9 is placed on top of wafer table 10, which are in turn placed on chuck 12 and long stroke drive 13. Measurement system 11 is connected to metrology frame 6 and provides measurements of the relative positioning of wafer table 10 and metro frame 6. The metro frame 6 typically is of relatively high mass and is suspended by vibration isolators 7 for example embodied by spring elements in order to dampen disturbances. The electron optical column 4 performs a final projection using projector 5. The projector 5 comprises a system of either electrostatic or electromagnetic projection lenses for projecting charged particle beams generated in the charged particle column onto the target. In the preferred embodiment as depicted, the projection lens system comprises an array of electrostatic charged particle lenses. For holding and fixating the entire projector, the lens system is included in a carrier frame.

To achieve the required accuracy over a large range of motion, the wafer positioning system typically comprises a long stoke component 13 for moving the wafer stage over a relatively large distance in the scanning direction and perpendicular to the scanning direction, and a short stroke component 12 for accurately performing the positioning of the target 9 and for correcting for disturbances. Relative positioning of the wafer stage with regard to the metro frame 6 is measured by measurement system 11. Target 9 is clamped onto the wafer table 10 to ensure fixation of the target 9 during projection of the charged particle beams onto the target.

Figure 2:
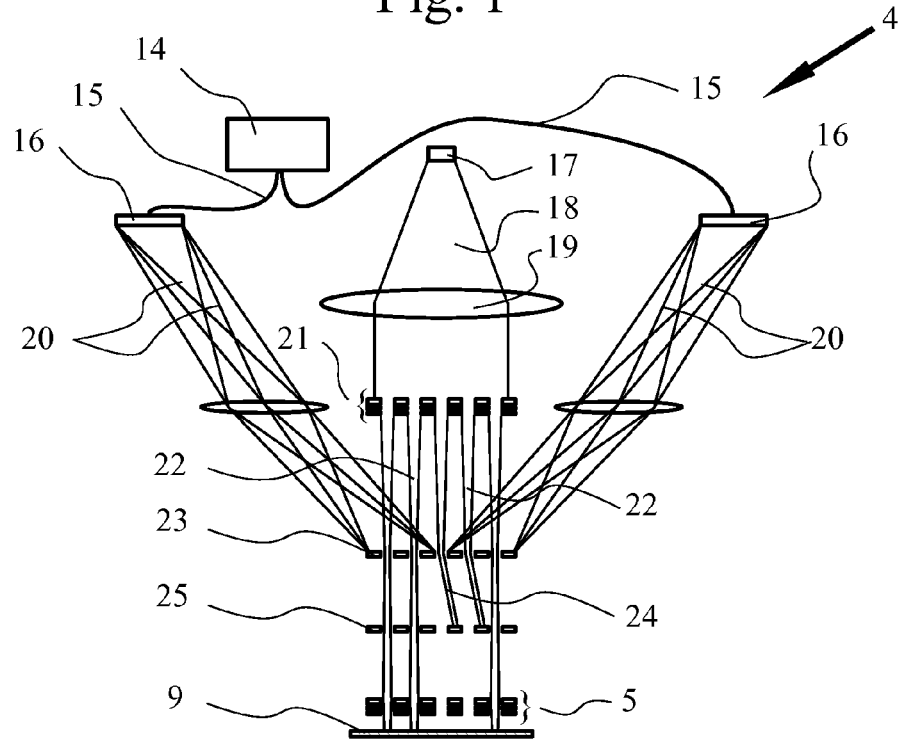
FIG. 2 shows in detail a schematic representation of the electron optical column of the known art charged particle exposure system.

FIG. 2 shows a schematic representation of a charged particle column 4. In this system a charged particle source 17 generates a charged particle beam 18. The charged particle beam subsequently passes collimator lens 19 for collimating the charged particle beam. Next, the collimated charged particle beam is transformed into a plurality of beamlets 22 by aperture array 21, comprising in this example a plate with through-holes, by blocking part of the collimated beam and allowing the beamlets 22 to pass through. This aperture array is typically located a significant distance from the collimator lens, in a field free region, as can be seen in FIG. 2.

The beamlets 22 are projected on blanking means 23 which in this example comprises an array of apertures provided with deflection means. The blanking means 23 is capable of deflecting individually selected beamlets 24 onto a beamstop 25 formed by an aperture array aligned with the array of apertures of blanker means 23, to let through non-deflected beamlets. Such deflection of beamlets 24 onto beamstop 25 effectively switches the deflected individual beamlets 24 "off", i.e. prevents them reaching the target. Non-deflected beamlets are able to pass through uninhibited and are thus not blanked by blanking array 23 and beam stop array 25. Control signals for the blanking array 23 are generated in pattern streamer 14 and sent as electrical signals 15 and converted into optical control signals by modulation means 16.

The optical control signals 20 are sent to the blanking array 23 in order to transport the switching instructions for blanking the beamlets. Projector 5 focuses the non-deflected beamlets 22 and deflects the non-deflected beamlets in a writing direction on the target 9 thus realising a final projection. The final projection of charged particle beamlets 22 onto the target 9 enables exposure, while simultaneously deflecting the beamlets 22 over the target 9 in a first direction, while target 9 is moved in a second direction transversely to the first direction by target positioning system 9-13.

Figure 3:
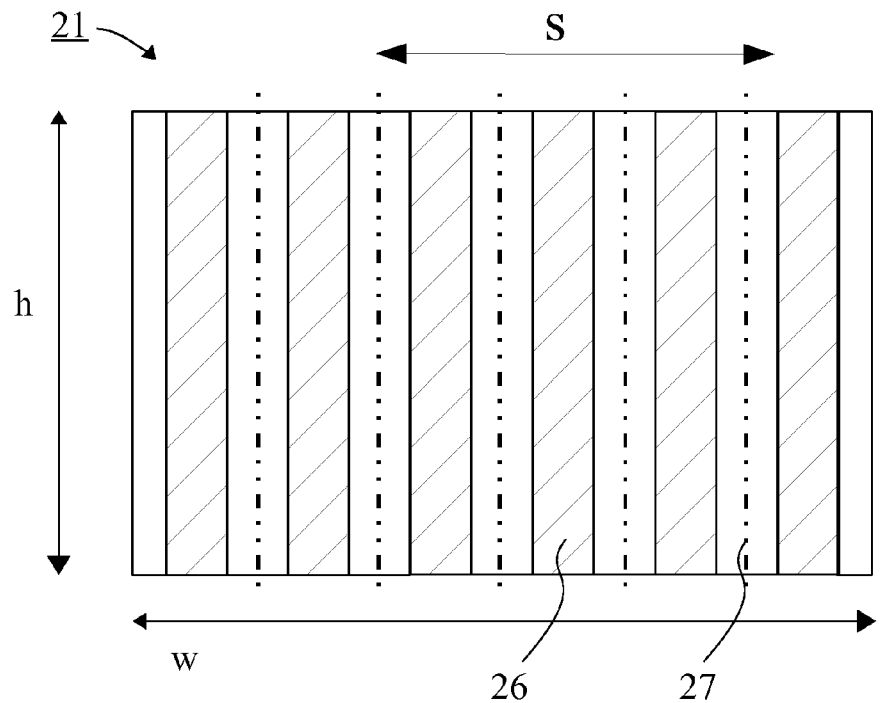
FIG. 3 shows a schematic top view of the second electrode, showing the alternating beam- and aperture free areas.

FIG. 3 schematically shows a top view of a topographic arrangement of components that may be used in an aperture array 21 according to embodiments of the invention. The aperture array is divided into aperture areas 26 and aperture free areas 27. The aperture areas 26 represent areas arranged to receive the charged particle beam and comprise apertures in the form of through holes. The aperture free areas 27 are arranged amongst other functions to provide support to the components within the aperture areas 21. The aperture free areas may be functionally divided in half, each half providing functions to the adjacent aperture area, as indicated by the dashed lines in FIG. 3. The target is scanned by the beamlets under the aperture array in direction S. Generally, height h of the aperture array may be at least 26 mm, and width w may be at least 26 mm, in this particular embodiment preferably more. It will be understood that variations on this layout may also be used, for example the aperture and aperture free areas need not be equally wide, and the orientation of the aperture and aperture free areas need not be exactly perpendicular to the scanning direction. The aperture array may be included as a second electrode in the system.

Figure 4A:
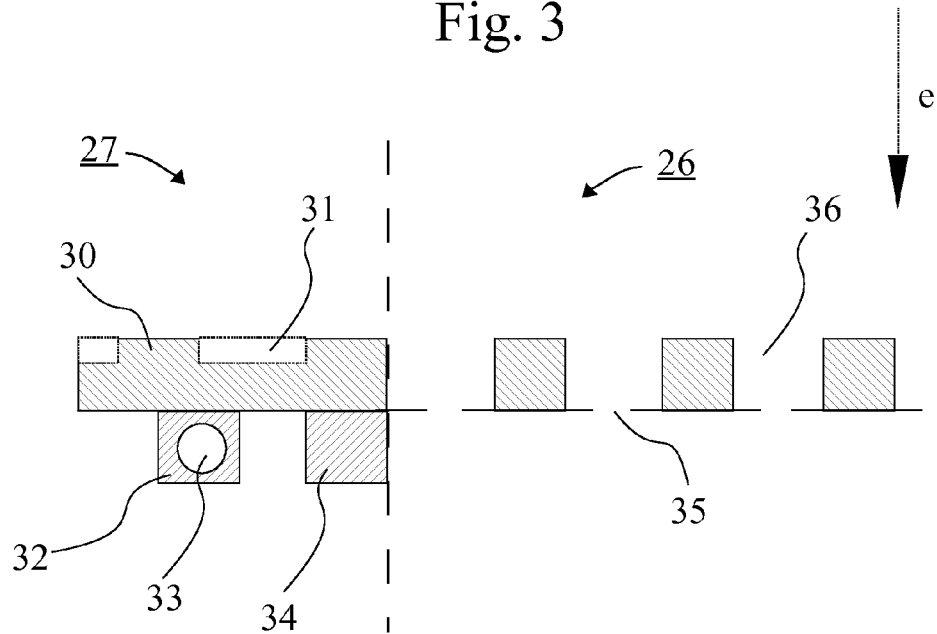
FIG. 4a schematically shows a cross-section of the second electrode, comprising an Aperture array element according to the present invention including a first embodiment of the apertures according to the invention.

FIG. 4a schematically shows a cross-section of a first embodiment of the aperture array, specifically the transition area between an aperture area 26 and aperture free area 27. In this figure, the direction of the charged particle beam and the direction of the accelerating electric field are indicated by arrow e. While only part of the aperture area 26 and aperture free area 27 is shown, both areas extend in the same plane, and multiple beam and non-aperture areas may be present as shown in FIG. 3. In this embodiment, the second electrode comprises a body 30 in which blind holes 31 are present, which blind holes are equal to the size of the apertures 36. These blind holes serve to preserve the uniformity of the electric field over the transition from aperture area to non aperture area. By maintaining the uniformity of the electric field, the charged particle beam is not disrupted right at the transition from aperture area to non aperture area.

The electrode may comprise support struts 32, 34 in the areas free of apertures, the aperture free areas 27. Support strut 32 comprises an internal conduit 33 through which a cooling medium may flow, which may be needed for cooling the electrode and the aperture array, thus preventing breakdown and failure. A cooling liquid may be circulated through the conduit system by pumping or by convection. Although only one conduit is shown in the figure, more may be present in other struts based on cooling requirements and vibration requirements. Only two struts are shown in the figure, however more may be present.

The aperture area 26 comprises through holes 36, or apertures 36 arranged in an aperture array for converting the charged particle beam into a plurality of charged particle beamlets. In one embodiment, the aperture may have a smaller exit opening 35 (where the beamlets exit the aperture) as compared to the entry opening (where the beamlets enter the aperture). In this manner the aperture serves as a current limiting aperture by reducing the cross-section of a beamlet passing through the aperture. This current limiting nature of the aperture reduces aberrations in the resulting plurality of charged particle beamlets.

Figure 4B:
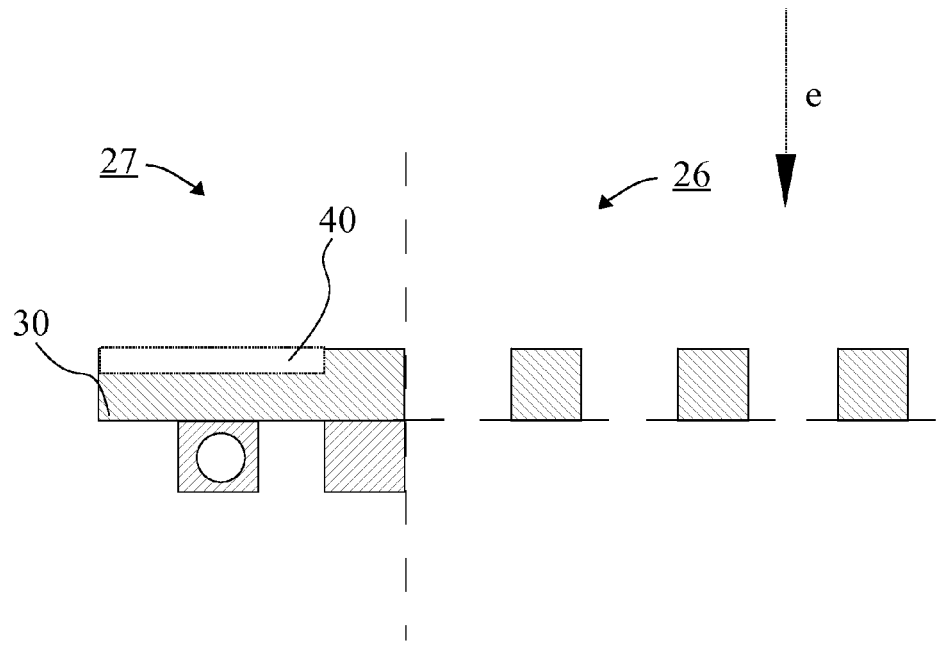
FIG. 4b schematically shows a second embodiment of the apertures according to the present invention.

FIG. 4b schematically shows a cross section of a second embodiment of the aperture array, where the aperture array is effectively raised above the surface of the body. It was found that creating one large blind hole 40 in the aperture free area 27, effectively raising the upper surface of the aperture area 26 above the upper surface of the aperture free area (in a direction facing the source, from which the beamlets arrive at the aperture array) also helps to preserve the uniformity of the electric field. Advantageously, this reduces the complexity of the aperture free area thus easing manufacture and reducing cost.

In the embodiments according to FIGS. 4a and 4b, the current limiting apertures may be recessed below the upper surface of the aperture area 26 facing the source. The recesses may be made by forming the apertures with a larger diameter entry (where beams enter the aperture) and smaller diameter current limiting portion part way along the bore of the aperture or at the exit (where the beams exit the aperture). In the embodiments of FIGS. 4a and 4b, the apertures are recessed by having a larger opening in the upper surface around each aperture, forming a depression in the upper surface stepping down to a smaller opening formed in the bottom of the depression. This results in the smaller exit opening of the aperture being recessed below the upper surface of the aperture array.

The current limiting apertures in FIGS. 4a and 4b may be recessed sufficiently to place the aperture at a level free of electric fields or with reduced electric field. The electric field which is present at the upper surface of the aperture array will bulge into the recess, so that a negative lens is formed under influence of the electric field. This may be advantageously used to project the charged particle beamlets on to a second aperture array, again in a current limiting manner. This second aperture array may be present further along the path of the beamlets.

Figure 4C:
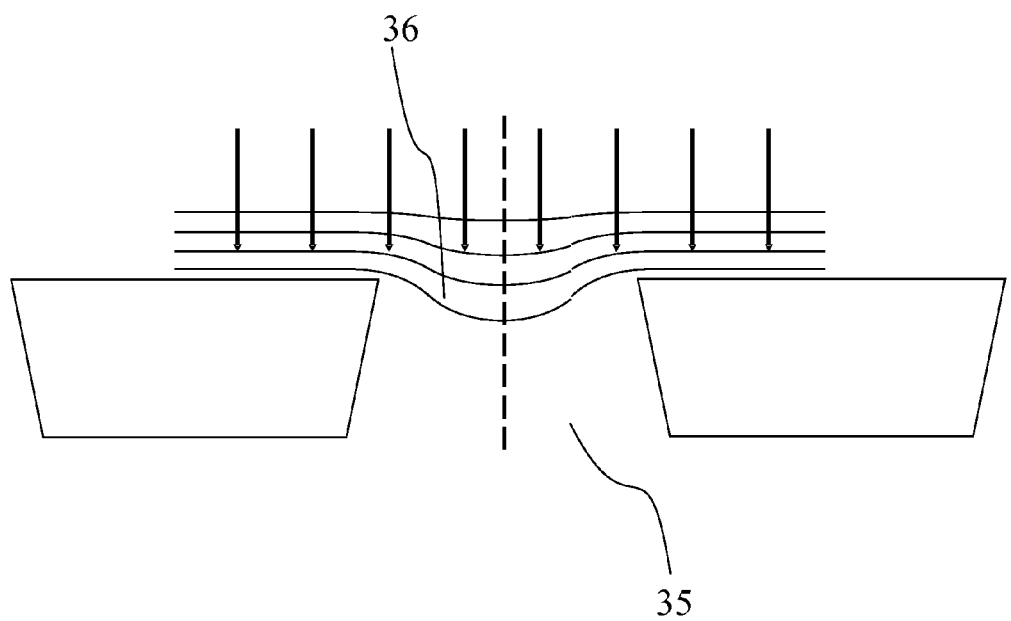
FIG. 4c schematically shows a second embodiment of the aperture array, included raised from the body.

FIG. 4c schematically shows a cross section of a second embodiment of the apertures according to the present invention. Only an individual aperture is shown, however a plurality of apertures according to this embodiment may be present in each aperture area of the aperture array. In this embodiment the entry 36 of the aperture is smaller than exit 35 so that the narrowest part of the aperture is at the aperture entry creating a cone shaped hole. In this manner the generation of secondary electrons is avoided, since primary electrons of the charged particle beams do no scrape the inner walls of the apertures. Further, any generated secondary electrons will experience an accelerating field towards the aperture. The electric field which is present at the upper surface of the aperture array will again bulge into the recess as shown in FIG. 4c. By careful selection of the dimensions the exit 35 may again be placed in a electric field free region as shown in FIG. 4c, Though only one aperture is shown here, the aperture array may also advantageously be raised above the surface as in FIGS. 4a and 4b.

Figure 5:
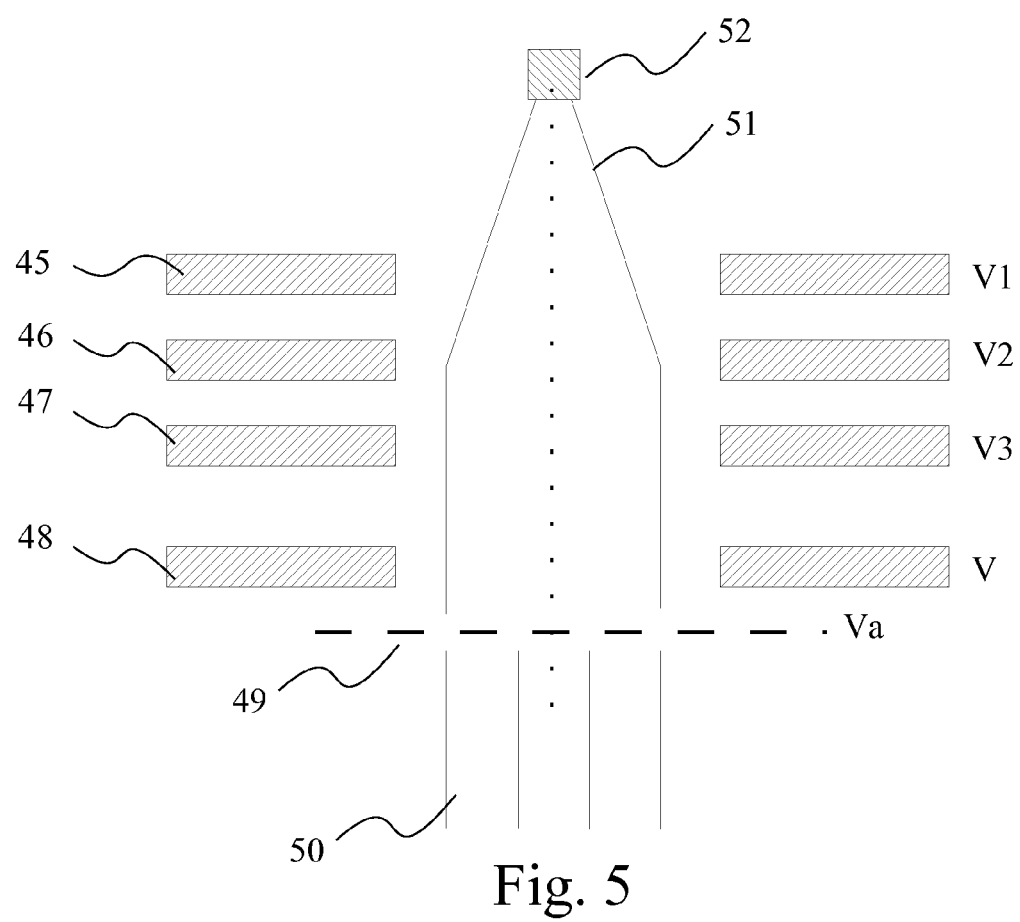
FIG. 5 schematically shows an embodiment of the converging means according to the invention using three additional electrodes.

FIG. 5 schematically shows an embodiment of a converging means according to the invention comprising first and second aperture arrays functioning as first and second electrodes, and three additional electrodes. The first electrode 48 comprises a single plate electrode and the second electrode 49 is again included as an aperture array.

The first and second electrode 48, 49 are arranged such that an electric field is present between them. This field may be an accelerating field (relative to the charged particle source, in fact the cathode of the charged particle source) or a decelerating field, according to what is required for exposing the target.

An accelerating field can be achieved by setting the first electrode at a voltage V, for instance 4 kV, and the second electrode at a higher voltage Va, for instance 5 kV, with respect to the charged particle source. Other voltages can also be used and achieve the same effect. In this manner and advantageously it is possible to actually add current to the charged particle beam, by placing a conductor in the charged particle beam and having the electric field end on the conductor, thus modifying the shape of the electric field. In this innovative manner, much better reduction of aberrations can be achieved than otherwise would be possible by only adjustment of the voltages of the electrodes V and Va and geometry of the electrodes such as their spacing, diameter and thickness. The potential of the first electrode may be adjusted such that secondary electrons generated by impact of the charged particle beam on the second electrode experience an accelerating field towards the second electrode thus reducing back scattering of the secondary electrons The three additional electrodes are arranged as a so called Einzel lens, used for collimating a diverging charged particle beam. The Einzel lens comprises 3 lens elements, an upper lens plate 45, set at a voltage V1, a middle lens plate 46 set at a voltage V2 and a lower lens plate 47 set at a voltage V3. For the lens to have a collimating effect V2 should be higher than V1 and V3 for beams with negative charged particles such as electrons. For example, V2 can be set at 20 kV and V1,V3 at 5 kV with respect to the charged particle source. Other voltages can also be used and achieve a similar effect.

During operation, a charged particle source 51 generates a diverging charged particle beam 51. When the diverging charged particle beam passes the three additional electrodes 45, 46, 47, the beam is collimated and passes through the first and second electrodes 48, 49. Finally, second electrode 49 functions to split the charged particle beam 51 into a plurality of charged particle beamlets 50, shown schematically in FIG. 5.

In this embodiment, the electrodes may have rounded edges for edges facing the charged particle beam. By rounding the edges, sharp edges are avoided, significantly lowering the possibility of electric discharge from the edges induced by the high electric field. Typically, the edges are curved with a radius of curvature between 30 and 70 mm at an edge facing the charged particle beam.

In general, the fill factor of the electrodes tends to be relatively low i.e. the area of a cross section of the charged particle beam is much smaller than the area of the opening in the electrodes through which the beam passes. However, a low fill factor places unwanted restrictions on the minimum size of the converging means, requiring the converging means to be larger than may be desired. For example, the required focal length of the projection system limits the available height of the charged particle optical system. A larger converging means results in a longer charged particle optical system and a longer focal length, which increases unwanted interactions between charged particles with the same charge. In addition, the charged particle source may not be placed inside the electric field of the electrodes and is located at some distance from the electrodes. Increasing the distance from the source to the electrodes may result in a decrease of brightness of the charged particle beam, and may increase coulomb interactions between the charged particles. In practice the distance between the charged particle source and the second electrode may be less than or equal to 300 mm while the bore diameter of the electrodes may be more than or equal to 40 mm. To overcome these problems, in one embodiment the fill factor is relatively high, in practice 50% or more.

For the proper operation of the system, it is necessary that all components are aligned to high accuracy. This can be achieved by integrating the electrodes into a single unit, both mechanically aligning the individual components and ensuring thermal disturbances cause the components to expand equally with respect to the optical axis.

Figure 6:
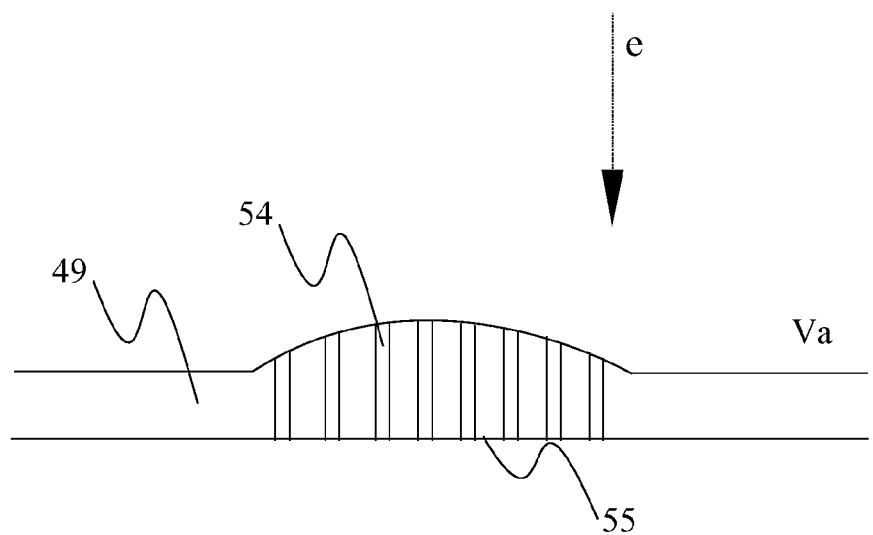
FIG. 6 schematically shows an embodiment of the curved surface of the aperture array.

FIG. 6 schematically shows, not to scale, an embodiment of the curved surface of the second electrode 49 in the form of an aperture array. In the embodiment shown in FIG. 6, the upper surface of the aperture array is curved upwards (in the direction of the source) in a simple convex shape to form a domed portion. The center of the curve may be 3 mm higher than the edge of the curved section, with a circumference of for example 50 mm. In this figure, the direction of the charged particle beam and the direction of the accelerating electric field are indicated by arrow e. The aperture areas 54 represent areas arranged to receive the charged particle beam and each area 54 comprises a plurality of apertures in the form of through holes. The aperture free areas 55 are areas free of apertures.

In another embodiment, the upper surface of the aperture array is curved upwards according to a cosine function centred around the optical axis of the system. It was found that this cosine shape provides even better aberration reduction.

In these embodiments the radius of the curved surface is larger than the diameter of charged particle beam where the beam intersects the surface of the aperture array.

In these embodiments, the aperture array may be subdivided into areas containing through holes for charged particle beamlets, and areas free of apertures, as described above. An accelerating electric field is present between another electrode and the second electrode. which may be set at a voltage Va, for instance 5 kV.

The first electrode and the curved second electrode included as an aperture array function together to significantly reduce aberrations in the charged particle system. In this manner, much better reduction of aberrations can be achieved than otherwise would be possible by mere adjustment of the voltages and geometry. The curved surface of the second electrode shapes the electric field lines of the electric field originating from the Einzel lens.

Figure 7:
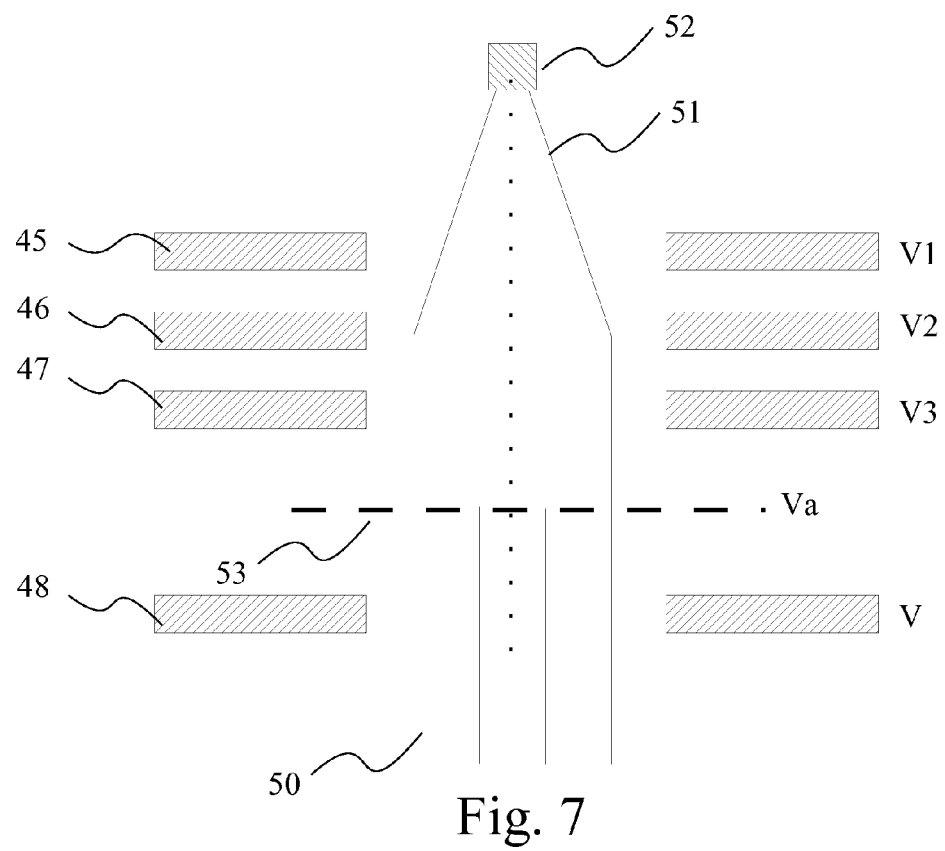
FIG. 7 schematically shows another embodiment of the converging means according to the invention using three additional electrodes.

FIG. 7 schematically shows, again not to scale, another embodiment of the converging means, in a different layout from the embodiment of FIG. 5. In this figure, identical parts have been numbered the same as in FIG. 5. The operation and advantages are comparable to the embodiment shown in FIG. 5. In this embodiment, the first electrode 48 is included as a single plate electrode as before and the second electrode 53 is again included as an aperture array but is now placed in front of the first electrode, closer to the source. An electric field is present between the first and second electrode. This field may be an accelerating or a decelerating field, according to what is required. The potential of the first electrode may be adjusted such that secondary electrons generated by impact on the second electrode experience an accelerating field towards the second electrode thus holding the secondary electrons in.

The three additional electrodes again are arranged as a so called Einzel lens, used for collimating a diverging charged particle beam. The Einzel lens comprises 3 lens elements, an upper lens plate 45, set at a voltage V1, a middle lens plate 46 set at a voltage V2 and a lower lens plate 47 set at a voltage V3. For the lens to have a collimating effect V2 should be higher than V1 and V3. For example, V2 can be set at 20 kV and V1,V3 at 5 kV with respect to the charged particle source. Other voltages can also be used and achieve the same effect.

Again during operation, a charged particle source 51 generates a diverging charged particle beam 51.

When the diverging charged particle beam passes the three additional electrodes, the beam is collimated and passes through the second electrode and then the first electrode. Second electrode 53 functions to split the charged particle beam 51 into a plurality of charged particle beamlets 50, schematically shown in FIG. 8.

Figure 8:
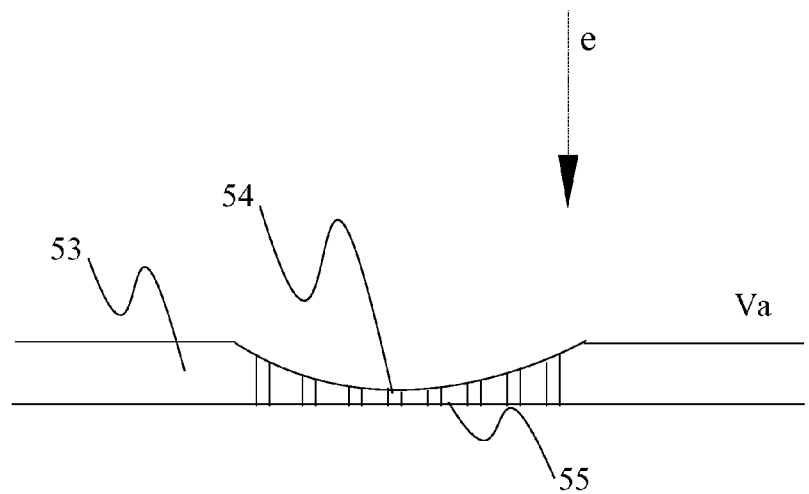
FIG. 8 schematically shows another embodiment of the curved surface of the aperture array.

FIG. 8 schematically shows an embodiment of the second electrode as included in the embodiment of FIG. 7.

In this embodiment, the upper surface of the second electrode aperture array is curved downwards (in a direction away from the source) in a simple convex shape to form a depression. Again, the curved surface of the electrode shapes the electric field lines of the electric field originating from the Einzel lens. The center of the curve may be 3 mm deeper than the edge of the curved section, with a diameter of for example 50 mm. In this figure, the direction of the charged particle beam and the direction of the accelerating electric field are indicated by arrow e, however a decelerating field may also be applied. The aperture areas 54 represent areas arranged to receive the charged particle beam and each area comprises apertures in the form of through holes. The aperture free areas 55 are areas free of apertures.

In another embodiment, the upper surface of the aperture array is curved downwards according to a cosine function centred around the optical axis of the system. It was found that this cosine shape provides even better aberration reduction.

In these embodiments the radius of the curved surface is larger than the diameter of the charged particle beam where the beam intersects the surface of the aperture array.

In these embodiments, the aperture array may still be subdivided into areas containing through holes for charged particle beamlets, and areas free of apertures, as described above.

Figure 9:
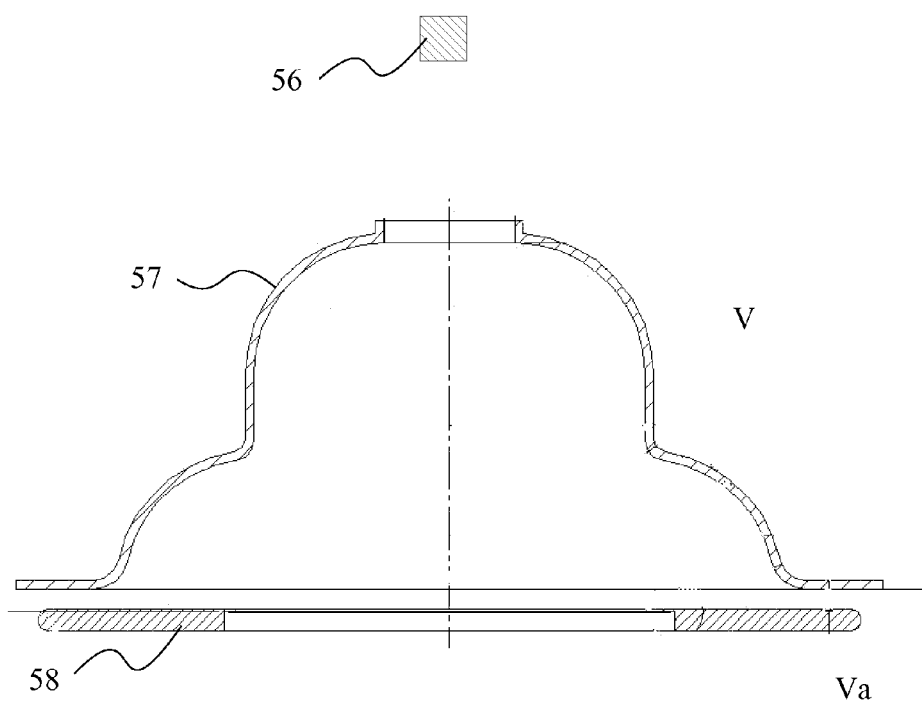
FIG. 9 schematically shows another embodiment of the converging means, comprising a single electrode.

FIG. 9 schematically shows a cross section of yet another embodiment of the converging means, comprising a single electrode collimator in the form of a first electrode 57 and an aperture array in the form of a second electrode 58. The charged particle source 56 during operation emits a charged particle beam (not shown).

The first electrode 57 is at a lower potential, and the second electrode 58 is at a higher potential. As a result, an accelerating field is present between the first electrode 57 and the second electrode 58. In one embodiment, the accelerating electric field between the first and second electrodes is for example achieved by setting the first electrode at a potential V in the range of 4.5 kV to 5.5 kV and the second electrode is at a potential Va in the range of 15 to 30 kV with respect to the charged particle source, in particular the cathode of the charged particle source.

The electric field between the first and second electrodes is such that the diverging charged particle beam converges, in this embodiment in such a way that the charged particle beam becomes substantially parallel. The charged particle beam then impinges on the second electrode 58. Because the second electrode 58 takes the form of an aperture array, the beam is converted into a plurality of charged particle beamlets. Besides blocking a portion of the beam, the second electrode 58 also effectively stops the electric field.

In this embodiment, the first electrode takes a form in which it comprises a first portion having a source facing side and a non-source facing side and a second portion having a source facing side and a non-source facing side. The first portion may have a first cross section at its non-source facing side, while the second portion may have a second cross section at its non-source facing side. The average diameter of the second cross section may be greater than the average diameter of the first cross section.

Preferably, the height of the first portion is greater than the height of the second portion. The portions may have a substantially circular shape with a rounded, convex profile, i.e. a bell-like shape. The single element collimator lens effectively refracts the diverging electron beam, in particular in the presence of an accelerating field. Such accelerating field may be generated by using the second electrode 58. The second electrode 58 takes the form of an aperture array, i.e. a plate with a plurality of apertures, to enable the creation of a plurality of beamlets.

In one embodiment, the first and second sections are joined using a rounded joint, reducing aberrations introduced in the charged particle beam. It was found that an electrode according to this embodiment can easily and economically be produced using plate material.

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

What is claimed is:

1. A charged particle lithography system for transferring a pattern onto the surface of a target, such as a wafer, comprising:
    a charged particle source adapted for generating a diverging charged particle beam;
    a converging means for refracting said diverging charged particle beam, the converging means comprising a first electrode; and
    an aperture array element comprising a plurality of apertures, the aperture array element forming a second electrode, wherein the second electrode is arranged to split the charged particle beam into a plurality of charged particle beamlets;
    wherein the system is adapted for creating an electric field between the first electrode and the second electrode,
    wherein the aperture array of the second electrode is subdivided into alternating aperture-free areas and areas where a plurality of apertures are present,
    and wherein the aperture free areas are provided with conduits for a cooling medium.

2. System according to claim 1, wherein the electric field is one of an accelerating electric field and a decelerating electric field.

3. System according to claim 1, wherein the aperture free areas are provided with one or more blind holes.

4. System according to claim 1, wherein the aperture array has an upper surface facing the charged particle source, and wherein the upper surface in the aperture free areas has a level raised above the upper surface in the aperture free areas.

5. System according to claim 1, wherein the apertures of the aperture array have a narrowest portion recessed below the upper surface facing the charged particle source.

6. System according to claim 5, wherein said narrowest portions of the apertures are recessed to a level free of the electric field.

7. System according to claim 6, wherein, in operation, the system forms a negative electrostatic lens at the locations of the apertures with a recessed narrowest portion.

8. System according to claim 1, wherein the fill factor of the first electrode is larger than 50%.

9. System according to claim 1, wherein the fill factor of the apertures in the second electrode is larger than 50%.

10. System according to claim 1, wherein the converging means further comprises at least three additional electrodes.

11. System according to claim 1, wherein one or more of the electrodes has a curved side facing the charged particle beam with a radius of curvature between 30 and 70 mm.

12. System according to claim 1, wherein the aperture array element is provided with a curved upper surface facing the charged particle source.

13. System according to claim 12, wherein the aperture array is subdivided into alternating aperture-free areas and aperture areas, each aperture area comprising a plurality of apertures, and wherein the curved upper surface encompasses a plurality of the aperture-free areas and aperture areas.

14. System according to claim 12, wherein the curved upper surface of the aperture array forms a raised dome-shaped area protruding above the upper surface towards the charged particle source.

15. System according to claim 1, wherein the converging means consists of a first electrode in the form of a single element collimator lens.

16. System according to claim 15, wherein the first electrode comprises a first convex portion and a second convex portion, the first portion having a first cross section, the second portion having a second cross section, wherein the average diameter of the second cross section is greater than the average diameter of the first cross section.

17. System according to claim 16, wherein the height of the first portion is greater than the height of the second portion.

18. System according to claim 15, wherein the first electrode is made out of plate material.

19. System according to claim 10, wherein the at least three additional electrodes are adapted to form an Einzel lens.

20. A charged particle lithography system for transferring a pattern onto the surface of a target, such as a wafer, comprising:
    a charged particle source adapted for generating a diverging charged particle beam;
    a converging means for refracting said diverging charged particle beam, the converging means comprising a first electrode; and
    an aperture array element comprising a plurality of apertures, the aperture array element forming a second electrode;
    wherein the system is adapted for creating an electric field between the first electrode and the second electrode;
    wherein the aperture array of the second electrode is subdivided into alternating aperture-free areas and areas where a plurality of apertures are present; and
    wherein the converging means consists of a first electrode in the form of a single element collimator lens; and
    wherein the first electrode comprises a first convex portion and a second convex portion, the first portion having a first cross section, the second portion having a second cross section,
    wherein the average diameter of the second cross section is greater than the average diameter of the first cross section.

21. A charged particle lithography system for transferring a pattern onto the surface of a target, such as a wafer, comprising:
    a charged particle source adapted for generating a diverging charged particle beam;

a converging means for refracting said diverging charged particle beam, the converging means comprising a first electrode; and an aperture array element comprising a plurality of apertures, the aperture array element forming a second electrode, wherein the second electrode is arranged to split the charged particle beam into a plurality of charged particle beamlets;

wherein the system is adapted for creating an electric field between the first electrode and the second electrode, and wherein the aperture array element is provided with a curved upper surface facing the charged particle source.

22. System according to claim 21, wherein the aperture array is subdivided into alternating aperture-free areas and aperture areas, each aperture area comprising a plurality of apertures, and wherein the curved upper surface encompasses a plurality of the aperture-free areas and aperture areas.

* * * * *